(12) United States Patent
Bellaouar

(10) Patent No.: US 6,990,154 B1
(45) Date of Patent: Jan. 24, 2006

(54) USING AN IF SYNTHESIZER TO PROVIDE RASTER COMPONENT OF FREQUENCY CHANNEL SPACING

(75) Inventor: Abdellatif Bellaouar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 764 days.

(21) Appl. No.: 09/706,068

(22) Filed: Nov. 3, 2000

(51) Int. Cl.
H04C 27/04 (2006.01)

(52) U.S. Cl. .................. 375/295; 375/307; 455/76
(58) Field of Classification Search ........ 375/295–315, 375/376; 331/1 A, 2, 16, 17, 18; 370/278; 455/76, 552.1; 332/100, 103, 145, 155, 161, 332/162
See application file for complete search history.

(56) References Cited

U.S. PATENT DOCUMENTS 5,722,040 A * 2/1998 Bjerede et al. ............ 455/76
6,069,535 A * 5/2000 Khlat ........................ 331/1 A
6,091,303 A * 7/2000 Dent ........................... 331/2
6,463,112 B1 * 10/2002 Hafez et al. ............... 375/376
6,556,545 B1 * 4/2003 Boesch ....................... 370/278

FOREIGN PATENT DOCUMENTS

EP 0 678 974 A 10/1995
EP 0 792 052 A 8/1997

* cited by examiner

Primary Examiner—Young T. Tse
Assistant Examiner—Edith Chang
(74) Attorney, Agent, or Firm—W. Daniel Swayze, Jr.; W. James Brady; Frederick J. Telecky, Jr.

(57) ABSTRACT

In the synthesis of frequency channel spacing in an RF transmission signal, a raster component of the desired frequency channel spacing is provided by an integer IF frequency synthesizer (44). Because the frequencies associated with the IF synthesizer are lower then those associated with an RF frequency synthesizer (48), the IF synthesizer can incorporate the desired raster using a lower feedback divisor (N) than can the RF synthesizer.

20 Claims, 4 Drawing Sheets

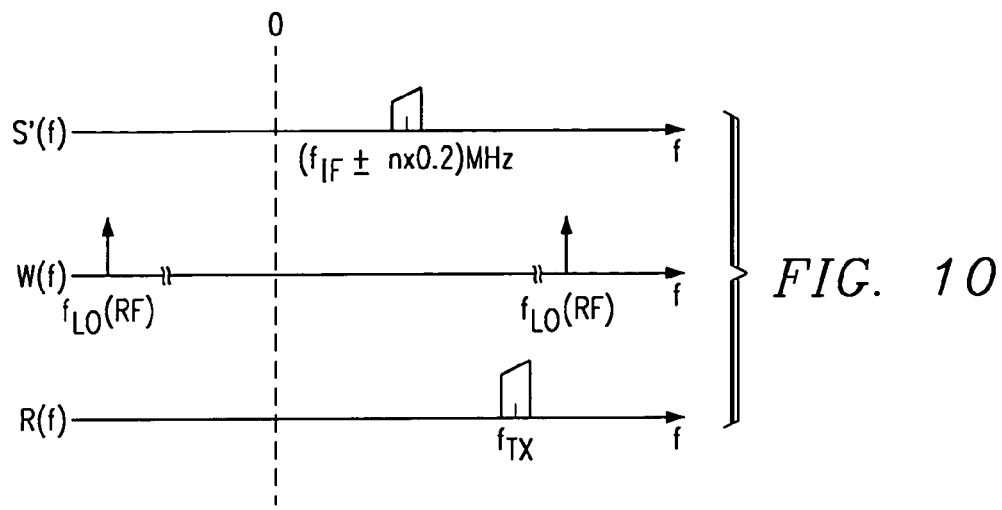
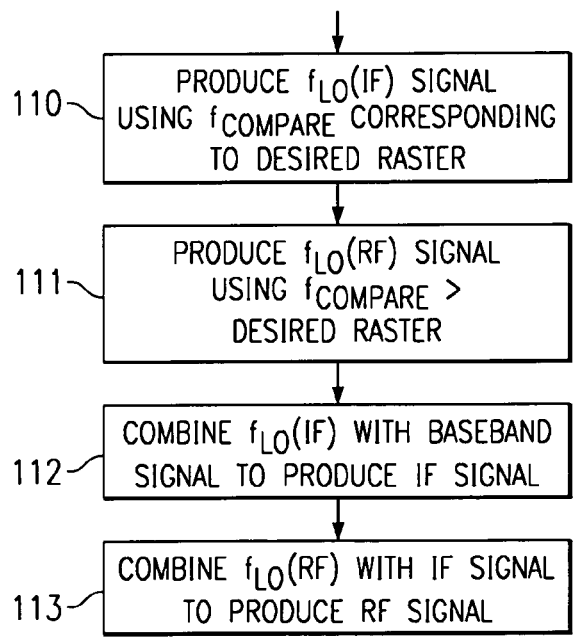
FIG. 10
FIG. 11
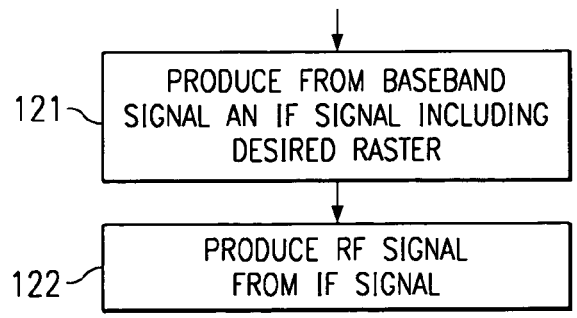
FIG. 12

USING AN IF SYNTHESIZER TO PROVIDE RASTER COMPONENT OF FREQUENCY CHANNEL SPACING

FIELD OF THE INVENTION

The invention relates generally to radio frequency communications and, more particularly, to frequency channel spacing in radio frequency communications.

BACKGROUND OF THE INVENTION

In some radio frequency (RF) communication systems, the channel spacing for the transmitter can be, for example, 5 MHz with a 200 KHz raster. This means that the channel spacing is as follows:

$$\Delta f_{channel} = 5 \pm n \times 0.2 \text{ MHz},$$

Where n is a small integer number. Thus, the channel spacing can be, for example, 4.6 MHz, 4.8 MHz, 5.0 MHz, 5.2 MHz, etc. Examples of RF systems that use such channel spacing include WCDMA systems and UMTS systems.

FIG. 1 diagrammatically illustrates a conventional example of an architecture for producing an output transmit frequency $f_{rx}$ having a desired channel spacing dependent upon the desired raster, for example, the channel spacing defined in the foregoing equation. In the example of FIG. 1, a baseband signal 11 is input to an intermediate frequency (IF) processing section 12 where it is combined with a signal 13 produced by a frequency synthesizer 14. The signal 13 has a frequency $f_{Lo}$ (IF) that, when combined with the baseband signal 11 produces an IF signal 15. In the conventional example of FIG. 1, the frequency of the signal 13 is a fixed frequency. The IF signal 15 is input to an RF processing section 16, where it is combined with a signal 17 produced by a frequency synthesizer 18. The RF processing section 16 produces at 19 an output frequency $f_{rx}$ having the desired channel spacing. The signal 17 output from the frequency synthesizer 18 has a frequency designated in FIG. 1 as $f_{Lo}$ (RF). The frequency synthesizer 18 has raster capability which provides the desired channel spacing in the output frequency $f_{rx}$.

FIG. 2 diagrammatically illustrates one example of the conventional frequency synthesizer 18 of FIG. 1, namely an integer phase locked loop (PLL) example. In the example of FIG. 2, a comparison frequency generator includes an oscillator 21 and a divider 23. The oscillator 21 provides a frequency reference 22 which is applied to a divider 23 that divides the frequency reference by a divisor R to produce at 24 a comparison frequency of 200 KHz. This 200 KHz comparison frequency corresponds to a desired 200 KHz raster. A divider 25 divides the output signal 17 by a divisor N in order to obtain at 26 another 200 KHz signal. The remaining components of FIG. 2, namely the frequency generator 27, the phase detector 28, the charge pump 29 and the loop filter 30 are well known in the PLL art, both structurally and functionally, and will therefore not be described in further detail.

In the example of FIG. 2, in order to achieve the desired 200 KHz raster, the comparison frequency at 24 must be set to 200 KHz, which also requires the divider 25 to produce a 200 KHz signal at 26. This requirement of producing a 200 KHz signal can cause the divisor N of the divider 25 to be a large number. For example, and referring also to FIG. 1, if the IF signal at 15 has a frequency of 400 MHz and the frequency for ranges from 1,920 to 1,980 MHz, then the frequency $f_{Lo}$ (RF) can be as high as 2,320 to 2,380 MHz when utilizing high-mode injection. Under these circumstances, the feedback divisor N would need to be nearly 12,000 in order to generate the 200 KHz frequency at 26. Such a large divisor N can disadvantageously result in high phase noise and therefore a large RMS phase error, and can also result in a disadvantageously slow lock time for the channel selection.

FIG. 3 diagrammatically illustrates another conventional PLL example of the frequency synthesizer 18 of FIG. 1. The synthesizer of FIG. 3 is a so-called fractional synthesizer, which is well known in the art. For larger values of M, such as M=8, the fractional frequency synthesizer can produce frequencies in the aforementioned range of 2,320 –2,380 MHz with a divisor N having a value of less than 1,500. Thus, the fractional synthesizer has the advantages of a relatively low feedback divisor N' and thus good phase performance, and a relatively fast lock time, particularly if the oscillator is pre-tuned. However, fractional synthesizers such as shown in FIG. 3 have the inherent disadvantage of fractional spurs, as well as the disadvantage of requiring a large capacitor in the loop filter, particularly for smaller values of the divisor N. The large capacitor is particularly disadvantageous if the frequency synthesizer is intended to be fully integrated.

It is therefore desirable in view of the foregoing to provide for synthesizing frequency channel spacing without the aforementioned disadvantages associated with conventional approaches.

In the synthesis of frequency channel spacing according to the present invention, the desired raster is advantageously provided by an integer IF frequency synthesizer. The frequencies associated with the IF synthesizer are lower than those associated with an RF synthesizer, so a lower feedback divisor can be used to provide the comparison frequency associated with the desired raster. Because the raster is provided for in the IF synthesizer, the RF synthesizer can advantageously utilize a higher comparison frequency (and a correspondingly lower feedback divisor) than in prior art systems.

BRIEF DESCRIPTION OF THE DRAWINGS

FIG. 10 is a spectral diagram which graphically illustrates signals used in the apparatus of FIG. 9.

FIG. 11 illustrates exemplary operations which can be performed by the embodiments of FIGS. 4–8.

FIG. 12 illustrates exemplary operations which can be performed by the embodiments of FIGS. 4–10.

DETAILED DESCRIPTION

Figure 4:
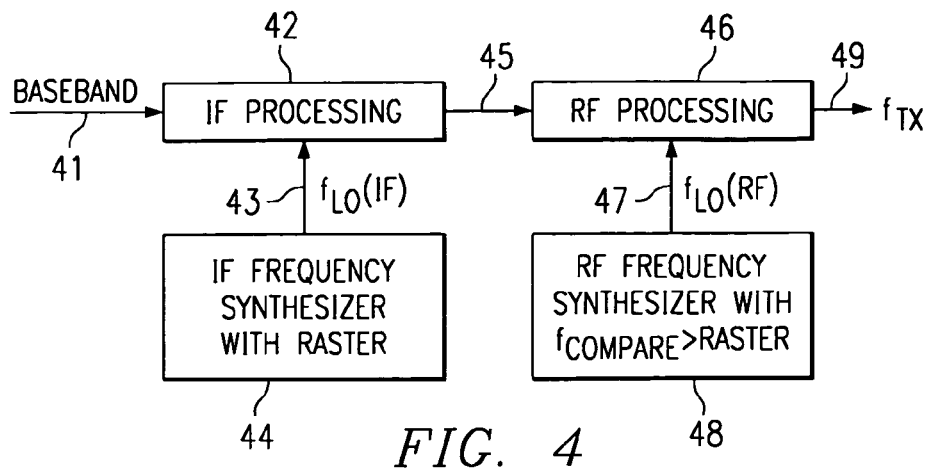
FIG. 4 diagrammatically illustrates a transmitter apparatus for producing an RF signal from a baseband signal according to the invention.

FIG. 4 diagrammatically illustrates pertinent portions of an exemplary transmitter apparatus (e.g. WCDMA or UMTS) for converting a baseband signal into an RF transmission signal according to the invention. In the exemplary apparatus of FIG. 4, a baseband signal 41 is input to an IF processing section 42 which combines the baseband signal with a further signal 43 produced by an IF frequency synthesizer 44. The signal 43 is provided at a frequency $f_{Lo}$ (IF). At 45, the IF processing stage 42 outputs an IF signal to an RF processing stage 46 which combines the IF signal 45 with a further signal 47 produced by an RF frequency synthesizer 48. The signal 47 has a frequency designated in FIG. 4 as $f_{Lo}$ (RF). The RF processing section 46 outputs at 49 an RF transmission signal at a frequency $f_{TX}$ having a desired channel spacing, for example, 5±nx 0.2 MHz.

Figure 1:
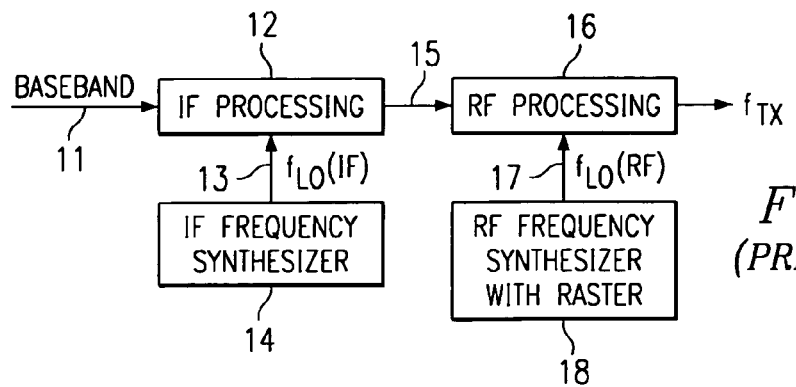
FIG. 1 diagrammatically illustrates a conventional apparatus for producing an RF signal from a baseband signal.
Figure 2:
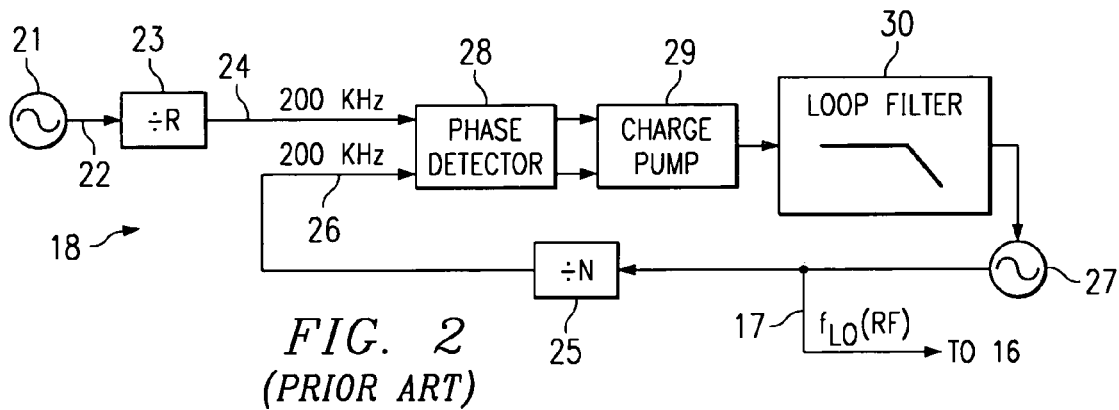
FIG. 2 diagrammatically illustrates a conventional example of a frequency synthesizer in FIG. 1.
Figure 3:
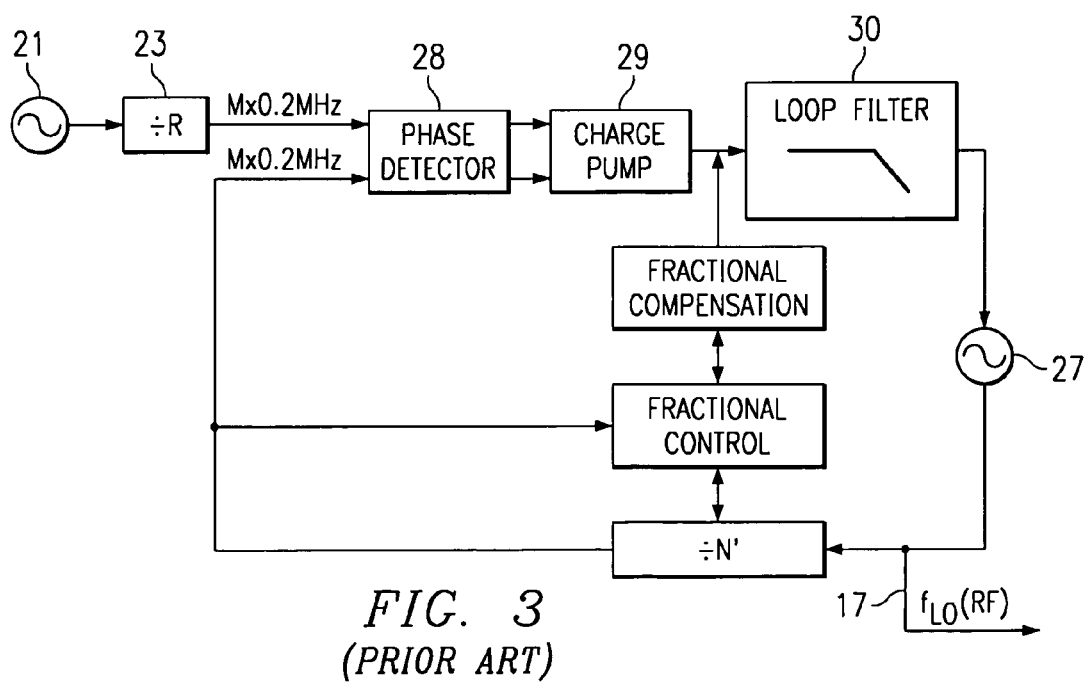
FIG. 3 diagrammatically illustrates another conventional example of a frequency synthesizer in FIG. 1.

According to the present invention, the IF frequency synthesizer 44 of FIG. 4 includes the rastering capability that is conventionally provided in RF frequency synthesizers (see, for example, 18 in FIG. 1). Because the frequency $f_{Lo}$ (IF) of the signal 43 produced by the IF frequency synthesizer 44 is substantially lower than the frequency $f_{Lo}$ (RF) of the signal 47 produced by the RF frequency synthesizer 48, the IF frequency synthesizer 44 can be advantageously used to provide the desired raster without requiring an undesirably large feedback divisor to produce the comparison frequency (which corresponds to the desired raster). Furthermore, because the raster is provided by the IF frequency synthesizer 44, the RF frequency synthesizer 48 can use any comparison frequency (designated as $f_{compare}$ in FIG. 4) that is greater than the desired raster.

Figure 5:
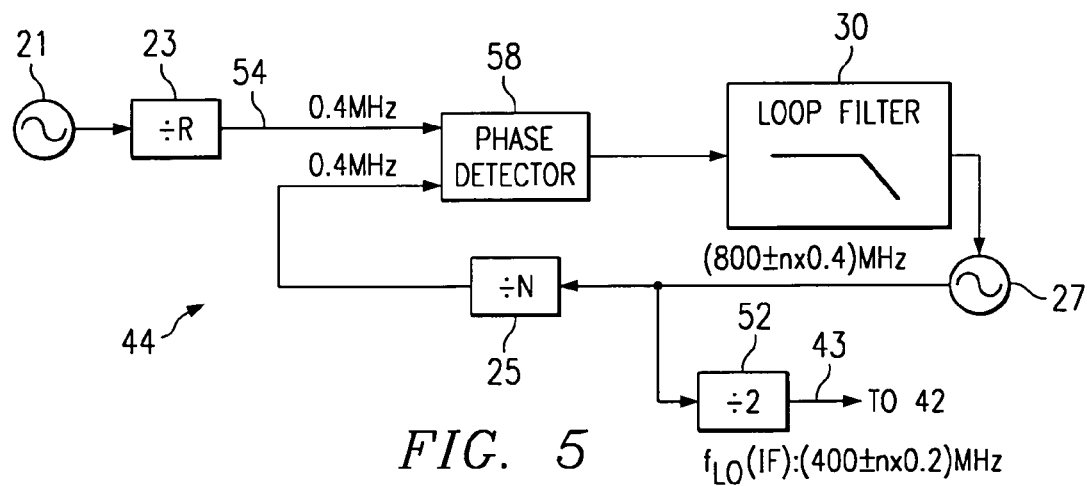
FIG. 5 diagrammatically illustrates an exemplary embodiment of the IF frequency synthesizer of FIG. 4.

FIG. 5 diagrammatically illustrates an exemplary embodiment of the IF frequency synthesizer 44 of FIG. 4. The embodiment of FIG. 5 is an integer PLL frequency synthesizer that provides a 200 KHz raster with a feedback divisor of N=2,000 and a 0.4 MHz comparison frequency at 54. Assuming N=2,000, if the divider at 52 divides by 4 (instead of 2 as illustrated), then the comparison frequency at 54 will be 0.8 MHz. As another example, if the divider 52 is eliminated from FIG. 5, then the comparison frequency at 54 would be 0.2 MHz (for a value of N=2,000). Note that the embodiment of FIG. 5 has a type-1 PLL structure wherein the phase detector 58 is coupled to the loop filter 30 without use of a charge pump. This type-1 structure, which is well-known in the art, can advantageously reduce the capacitor values in the loop filter.

Figure 6:
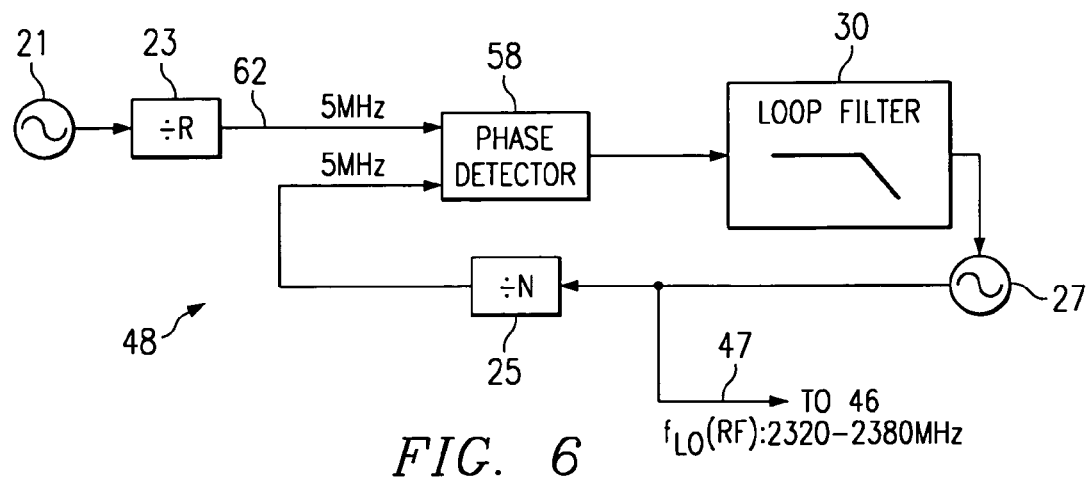
FIG. 6 diagrammatically illustrates an exemplary embodiment of the RF frequency synthesizer of FIG. 4.

FIG. 6 diagrammatically illustrates an exemplary embodiment of the RF frequency synthesizer 48 of FIG. 4. The frequency synthesizer of FIG. 6 is an integer PLL frequency synthesizer. The RF frequency synthesizer of FIG. 6 uses a 5 MHz comparison frequency at 62 and a typical feedback divisor value of N=470. Referring also to FIGS. 4 and 5, the apparatus of FIG. 4 can provide the same output frequency (1920–1980 MHz) with the same channel spacing (5±nx 0.2 MHz) as is provided by the conventional apparatus of FIG. 1, but using feedback divisors of N=2,000 (in FIG. 5) and N=470 (in FIG. 6) instead of the prior art feedback divisor of N=12,000. The respective feedback divisors of the frequency synthesizers 44 and 48 are significantly lower than the feedback divisors associated with prior art arrangements such as shown in FIG. 1, thus providing improved phase noise performance and faster locking as compared to prior art arrangements. The exemplary frequency synthesizer 48 is also implemented as a type-1 PLL.

If the available oscillator 21 of FIG. 6 does not permit generation of a 5 MHz comparison frequency at 62 (for example a 13 MHz reference frequency from the oscillator 21 would not permit derivation of a 5 MHz comparison frequency if R is an integer), then another relatively high comparison frequency can be used. For example, with a 13 MHz reference frequency from the oscillator 21, the divider at 23 can derive a 1 MHz comparison frequency at 62 if R=13. With a 1 MHz comparison frequency, the feedback divisor would have a typical value of N=2,350, which is still significantly lower than the feedback divisors associated with conventional arrangements.

Figure 7:
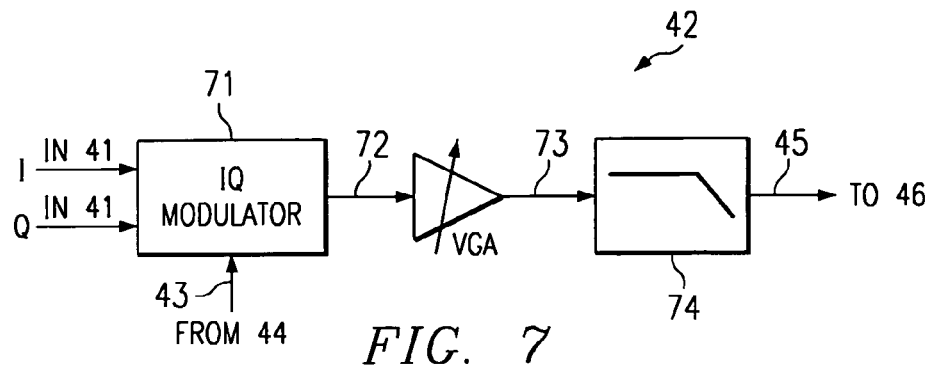
FIG. 7 diagrammatically illustrates pertinent portions of an exemplary embodiment of the IF processing stage of FIG. 4.
Figure 8:
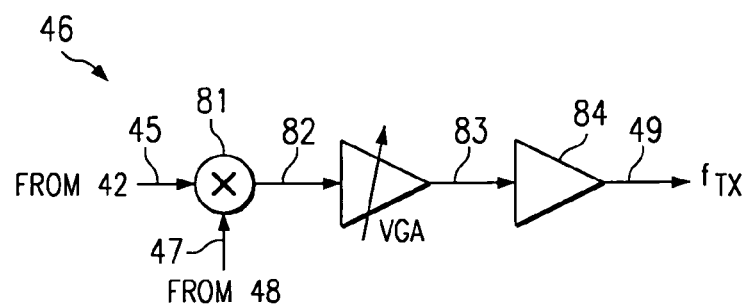
FIG. 8 diagrammatically illustrates pertinent portions of an exemplary embodiment of the RF processing stage of FIG. 4.

FIGS. 7 and 8 diagrammatically illustrate exemplary embodiments of the IF processing section 42 and the RF processing section 46, respectively. In the embodiment of FIG. 7, the baseband I and Q signals are input to a conventional IQ modulator 71. The modulator 71 can utilize conventional techniques to combine the signal 43 (see FIG. 4) with the baseband I and Q signals to produce an output signal 72 which is applied to a conventional variable gain amplifier (VGA). The output 73 of the VGA is applied to a conventional low-pass filter 74 whose output is coupled to the RF processing section 46 of FIG. 4.

The embodiment of FIG. 8 includes a conventional mixer 81 (for example, an SSB mixer or a DSB mixer) which receives the output 45 from the IF processing section 42 (see FIG. 4). The mixer 81 mixes the IF signal 45 with the signal 47 produced by the RF frequency synthesizer 48 of FIG. 4. The output 82 of the mixer 81 is provided to a conventional VGA whose output 83 is applied to a conventional power amplifier/driver 84 which provides the output signal 49 of FIG. 4.

Figure 9:
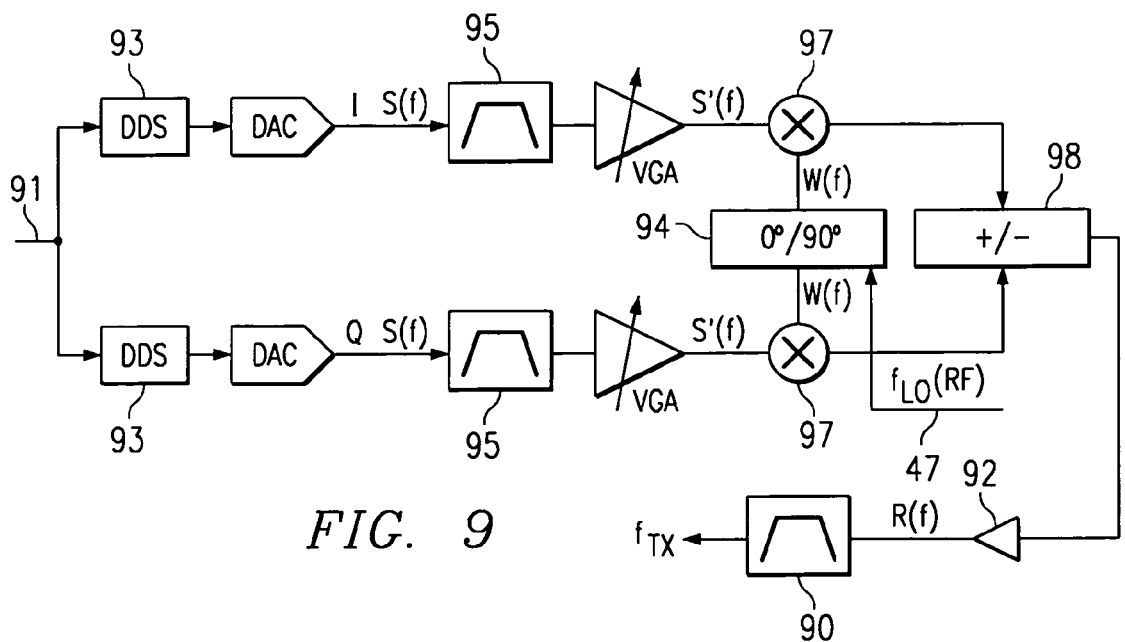
FIG. 9 diagrammatically illustrates another transmitter apparatus according to the invention for producing an RF signal from a baseband signal.

FIG. 9 illustrates another exemplary apparatus (e.g. WCDMA or UMTS) according to the invention for converting baseband signals into RF transmission signals. In the exemplary apparatus of FIG. 9, a modulating digital baseband signal at 91 is applied to a pair of DDS (direct digital synthesizer) sections at 93. The outputs of the DDS sections are input to respective digital-to-analog converters (DACs) to produce baseband I and Q signals also designated as S(f) in FIG. 9. The I and Q signals are input to respective bandpass filters 95. The outputs of the filters 95 are input to respective VGAs, and the outputs of the VGAs are designated as S'(f) in FIG. 9. The S'(f) components are input to respective mixers 97 which mix the respective components of S'(f) with a signal W(f) generated by a phase shifter 94. The phase shifter 94 produces the signal W(f) from, for example, the signal 47 produced by the RF frequency synthesizer 48 of FIG. 6. The outputs of the mixers 97 are combined by a combiner 98 whose output is coupled to a power amplifier/driver 92 that produces a signal R(f). The signal R(f) is input to a bandpass filter 90, for example a SAW filter, that provides an output transmission signal having the frequency $f_{TX}$ and the desired channel spacing. In the arrangement of FIG. 9, the DDS sections 93 generate the desired (e.g., 200 KHz) raster.

FIG. 10 illustrates the frequency spectra of the signals S'(f), W(f) and R(f) of FIG. 9. The signals I and Q corresponding to spectrum S'(f) are provided at a frequency of $f_{IF}$ ±nx 0.2 MHz, where the "0.2" factor corresponds to the desired raster and the $f_{IF}$ component corresponds to the desired IF frequency.

FIG. 11 illustrates exemplary operations which can be performed by the embodiments of FIGS. 4–8. At 110, a signal at frequency $f_{Lo}$ (IF) is produced using a comparison frequency corresponding to the desired raster. At 111, a signal at frequency $f_{Lo}$ (RF) is produced using a comparison frequency that is greater than the desired raster. At 112, the signal at frequency $f_{Lo}$ (IF) is combined with the baseband signal to produce an IF signal and, at 113, the signal at frequency $f_{Lo}$ (RF) is combined with the IF signal to produce the desired RF transmission signal.

FIG. 12 illustrates exemplary operations which can be performed by the embodiments of FIGS. 4–10. At 121, an IF signal, including the desired raster, is produced from the baseband signal. At 122, an RF signal is produced from the IF signal.

It will be evident to workers in the art that the embodiments described above with respect to FIGS. 4–12 can be readily implemented, for example by suitable modifications in software, hardware, or a combination of software and hardware, in conventional RF transmitters, for example, WCDMA and UMTS transmitters.

Although exemplary embodiments of the invention are described above in detail, this does not limit the scope of the invention, which can be practiced in a variety of embodiments.

What is claimed is:

1. An apparatus for producing an RF transmission signal including a plurality of frequency channels, comprising:
   an IF processor having a first input for receiving a baseband signal and a second input for receiving a first combining signal, said IF processor for combining the baseband signal with the first combining signal to produce an IF signal;
   an RF processor having a first input coupled to said IF processor for receiving the IF signal and a second input for receiving a second combining signal, said RF processor for combining the IF signal with the second combining signal to produce said RF transmission signal including the plurality of frequency channels separated by a desired frequency channel spacing;
   a first frequency synthesizer coupled to said second input of said IF processor for providing the first combining signal at one of a plurality of possible frequencies separated from one another by a raster component of said desired frequency channel spacing; and
   said first frequency synthesizer including a comparison frequency generator for generating a comparison frequency corresponding to said raster component, said first frequency synthesizer responsive to said comparison frequency for producing the first combining signal.

2. The apparatus of claim 1, wherein the comparison frequency is an integer multiple of said raster component.

3. The apparatus of claim 1, wherein the comparison frequency is equal to said raster component.

4. The apparatus of claim 1, wherein said first frequency synthesizer includes an integer phase locked loop.

5. The apparatus of claim 4, wherein said phase locked loop is a type-1 phase locked loop.

6. The apparatus of claim 1, wherein said apparatus is in a UMTS (Universal Mobile Telecommunication System) transmitter.

7. The apparatus of claim 1 wherein said apparatus is in a WCDMA transmitter.

8. The apparatus of claim 1, further including a second frequency synthesizer coupled to said second input of said RF processor for providing the second combining signal, said second frequency synthesizer comprising a comparison frequency generator for generating a further comparison frequency that is greater than said raster component, said second frequency synthesizer responsive to said further comparison frequency for producing the second combining signal.

9. The apparatus of claim 8, wherein the further comparison frequency corresponds to a component of said desired frequency channel spacing other than said raster component.

10. The apparatus of claim 8, wherein said second frequency synthesizer includes an integer phase locked loop.

11. A method for producing an RF transmission signal including a plurality of frequency channels separated by a desired frequency channel spacing, comprising:
    providing a first combining signal at one of a plurality of possible frequencies separated from one another by a raster component of the desired frequency channel spacing, including generating a comparison frequency corresponding to said raster component and producing the first combining signal in response to said comparison frequency;
    combining the first combining signal with a baseband signal to produce an IF signal; and
    combining the IF signal with a second combining signal to produce the RF transmission signal.

12. The method of claim 11, wherein the comparison frequency is an integer multiple of said raster component.

13. The method of claim 11, wherein the comparison frequency is equal to said raster component.

14. The method of claim 11, wherein said providing step includes using an integer phase locked loop to produce the first combining signal.

15. The method of claim 14, wherein said using step includes using a type-1 phase locked loop to produce the first combining signal.

16. The method of claim 11, wherein the RF transmission signal is a UMTS (Universal Mobile Telecommunication System) transmission signal.

17. The method of claim 11, wherein the RF transmission signal is a WCDMA transmission signal.

18. The method of claim 11, including generating a further comparison frequency that is greater than said raster component, and producing the second combining signal in response to said further comparison frequency.

19. The method of claim 18, wherein the further comparison frequency corresponds to a component of said desired frequency channel spacing other than said raster component.

20. The method of claim 18, wherein said step of producing the second combining signal includes using an integer phase locked loop to produce the second combining signal.

* * * * *